(12) United States Patent
Park et al.

(10) Patent No.: US 8,238,161 B2
(45) Date of Patent: Aug. 7, 2012

(54) NONVOLATILE MEMORY DEVICE

(75) Inventors: Kitae Park, Seongnam-si (KR); Hyun-Sil Oh, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 299 days.

(21) Appl. No.: 12/608,384

(22) Filed: Oct. 29, 2009

(65) Prior Publication Data

US 2010/0124120 A1 May 20, 2010

(30) Foreign Application Priority Data

Nov. 17, 2008 (KR) .......... 10-2008-0114027
Jun. 23, 2009 (KR) .......... 10-2009-0056149

(51) Int. Cl.
*G11C 11/34* (2006.01)
*G11C 16/04* (2006.01)

(52) U.S. Cl. .......... 365/185.19; 365/185.02; 365/185.28

(58) Field of Classification Search ............. 365/185.02, 365/185.19, 185.28
See application file for complete search history.

(56) References Cited

U.S. PATENT DOCUMENTS

| | | | |
|---|---|---|---|
| 7,064,986 B2 | 6/2006 | Lee et al. | |
| 7,272,043 B2 | 9/2007 | Liao et al. | |
| 8,064,252 B2 * | 11/2011 | Yip | 365/185.03 |
| 2004/0080980 A1 * | 4/2004 | Lee | 365/185.17 |
| 2007/0047314 A1 * | 3/2007 | Goda et al. | 365/185.18 |
| 2007/0236990 A1 * | 10/2007 | Aritome | 365/185.01 |
| 2007/0291542 A1 * | 12/2007 | Aritome | 365/185.18 |
| 2008/0049494 A1 * | 2/2008 | Aritome | 365/185.02 |
| 2011/0026331 A1 * | 2/2011 | Dong et al. | 365/185.19 |
| 2011/0032757 A1 * | 2/2011 | Dutta et al. | 365/185.02 |

FOREIGN PATENT DOCUMENTS

| | | |
|---|---|---|
| JP | 2001052487 A | 2/2001 |
| KR | 100142368 B1 | 3/1998 |
| KR | 100496797 B1 | 6/2005 |
| KR | 1020050109835 A | 11/2005 |
| KR | 1020060108324 A | 10/2006 |
| WO | 2006012292 A1 | 2/2006 |

* cited by examiner

*Primary Examiner* — Ly D Pham

(74) *Attorney, Agent, or Firm* — Volentine & Whitt, PLLC

(57) ABSTRACT

A nonvolatile memory device includes; a memory cell array including a plurality of memory cells arranged in word lines and bit lines, a high-voltage generator generating a program voltage pulse applied to a selected word line among the word lines, and a pass voltage applied to a non-selected word line, and control logic iteratively increasing the program voltage pulse and adjusting the pass voltage according to a defined increment during a program operation.

9 Claims, 18 Drawing Sheets

NONVOLATILE MEMORY DEVICE

CROSS-REFERENCE TO RELATED APPLICATION

This U.S. non-provisional patent application claims priority under 35 U.S.C. §119 to Korean Patent Application Nos. 10-2009-0056149 filed on Jun. 23, 2009, and 10-2008-0114027 filed on Nov. 17, 2008, the collective subject matter of which is hereby incorporated by reference.

BACKGROUND

The present inventive concept relates generally to nonvolatile memory devices. More particularly, the inventive concept relates to nonvolatile memory devices controlling a program voltage pulse.

Examples of nonvolatile memory devices include flash memory devices and variable resistance memory devices. Contemporary flash memory devices may be generally categorized as NAND flash memory or NOR flash memory. NOR flash memory has a structure in which memory cells are independently connected to a bit line and a word line. NOR flash memory is characterized by fast (random) data access speeds. In contrast, NAND flash memory requires only one contact per memory cell string because a plurality of memory cells are connected in series. NAND flash memory is characterized by very high memory cell integration density.

Flash memory like other forms of nonvolatile memory retain stored data in the absence of applied powered. Within mobile devices such as cellular phones, PDA digital cameras, portable game consoles, and MP3 players, flash memory is widely used to store programming code and payload data. Flash memory devices may also be used in home applications such as HDTVs, DVDs, routers, and GPSs.

Many conventional nonvolatile memory devices are configured to incorporate a memory cell array including multi-bit memory cells capable of storing more than one data bit per memory cell in order to further enhance data storage density. Multi-bit memory cells are commonly referred to as Multi-Level Cells (MLCs), while single-bit memory cells are referred to as Single-Level Cells (SLCs). As is well understood in the art, MLCs operate to store data using two or more threshold voltage distributions.

SUMMARY

Embodiments of the inventive concept provide a nonvolatile memory device capable of maintaining an increased program voltage in relation to a defined ISPP constant. Embodiments of the inventive concept also provide a nonvolatile memory device characterized by an improved pass voltage window that reduces the possibility of memory cell over-programming.

In one embodiment, the present inventive concept provides a memory device comprising; a memory cell array comprising a plurality of memory cells arranged in word lines and bit lines, a high-voltage generator configured to generate a program voltage pulse applied to a selected word line among the word lines, and a pass voltage applied to a non-selected word line, and control logic configured to iteratively increase the level of the program voltage pulse and adjust the level of the pass voltage according to a defined increment during a program operation.

In another embodiment, the present inventive concept provides a nonvolatile memory device comprising; a memory cell array comprising a plurality of memory cells arranged in word lines and bit lines, a high-voltage generator configured to generate a program voltage pulse applied to a selected word line among the word lines and at least one pass voltage applied to a non-selected word line, and control logic configured to iteratively increase the program voltage pulse and apply different pass voltages having different voltage levels to non-selected word lines in accordance with their location in the memory cell array, wherein the control logic is further configured to fix the pass voltage applied to a non-selected word line adjacent to the selected word line at a constant level during a program operation.

In another embodiment, the present inventive concept provides a nonvolatile memory device comprising; a memory cell array comprising a plurality of memory cells arranged in word lines and bit lines, a high-voltage generator configured to generate a program voltage pulse applied to a selected word line among the word lines and at least one pass voltage applied to a non-selected word line, and control logic configured to iteratively increase the program voltage pulse during a program operation, wherein the control logic is further configured to determine a position of the selected word line and the high-voltage generator is further configured to control a level of the pass voltage in accordance with a location of the selected word line in the memory cell array during the program operation.

In another embodiment, the present inventive concept provides a nonvolatile memory device comprising; a memory cell array comprising a plurality of memory cells arranged in word lines and bit lines, a high-voltage generator configured to generate a program voltage pulse applied to a selected word line among the word lines and a pass voltage applied to a non-selected word line, and control logic configured to control the high-voltage generator to iteratively increase the program voltage by increments during a program operation, wherein the control logic is further configured to determine a location of the selected word line in the memory cell array, and the high-voltage generator is further configured to control an initial voltage level for the program voltage according to the determined location of the selected word line during the program operation.

BRIEF DESCRIPTION OF THE DRAWINGS

Embodiments of the inventive concept will be described with reference to the accompanying drawings. In the drawings.

DETAILED DESCRIPTION OF EMBODIMENTS

Embodiments of the inventive concept will now be described in some additional detail with reference to the accompanying drawings. The inventive concept may, however, be embodied in different forms and should not be construed as being limited to only the illustrated embodiments. Rather, these embodiments are presented as teaching examples.

As the design rule for flash memory devices has been reduced over the years, the importance of defining and adequately maintaining the so-called pass voltage (Vpass) window has been magnified. For example, in a program operation of a flash memory, a program voltage (Vpgm) is applied to a selected word line, and a pass voltage (Vpass) is applied to a non-selected word line. Since the well understood program voltage disturb may be due to a low pass voltage, program-prohibited cells among a plurality of memory cells connected to a word line where the program voltage is applied are programmed, thus causing a fail condition to arise. In contrast, when a pass voltage disturb is due to a high pass voltage, cells where a pass voltage is applied among memory cells connected to the same cell string are programmed and also cause a fail condition to arise. That is, the pass voltage window refers to a pass voltage range wherein both the pass voltage disturb and program voltage disturb are not generated. Accordingly, a flash memory device may be operated with greater reliability with a larger pass voltage window.

In order to improve (e.g., maximize) a pass voltage window, a corresponding pass voltage may be controlled in response to a program voltage that is increased according to a defined Incremental Step Pulse Program (ISPP) during a program operation. Here, the increase of the program voltage is constantly maintained to perform an exact program operation.

Figure (FIG.) 1 is a block diagram illustrating a memory system according to an embodiment of the inventive concept.

Figure 1:
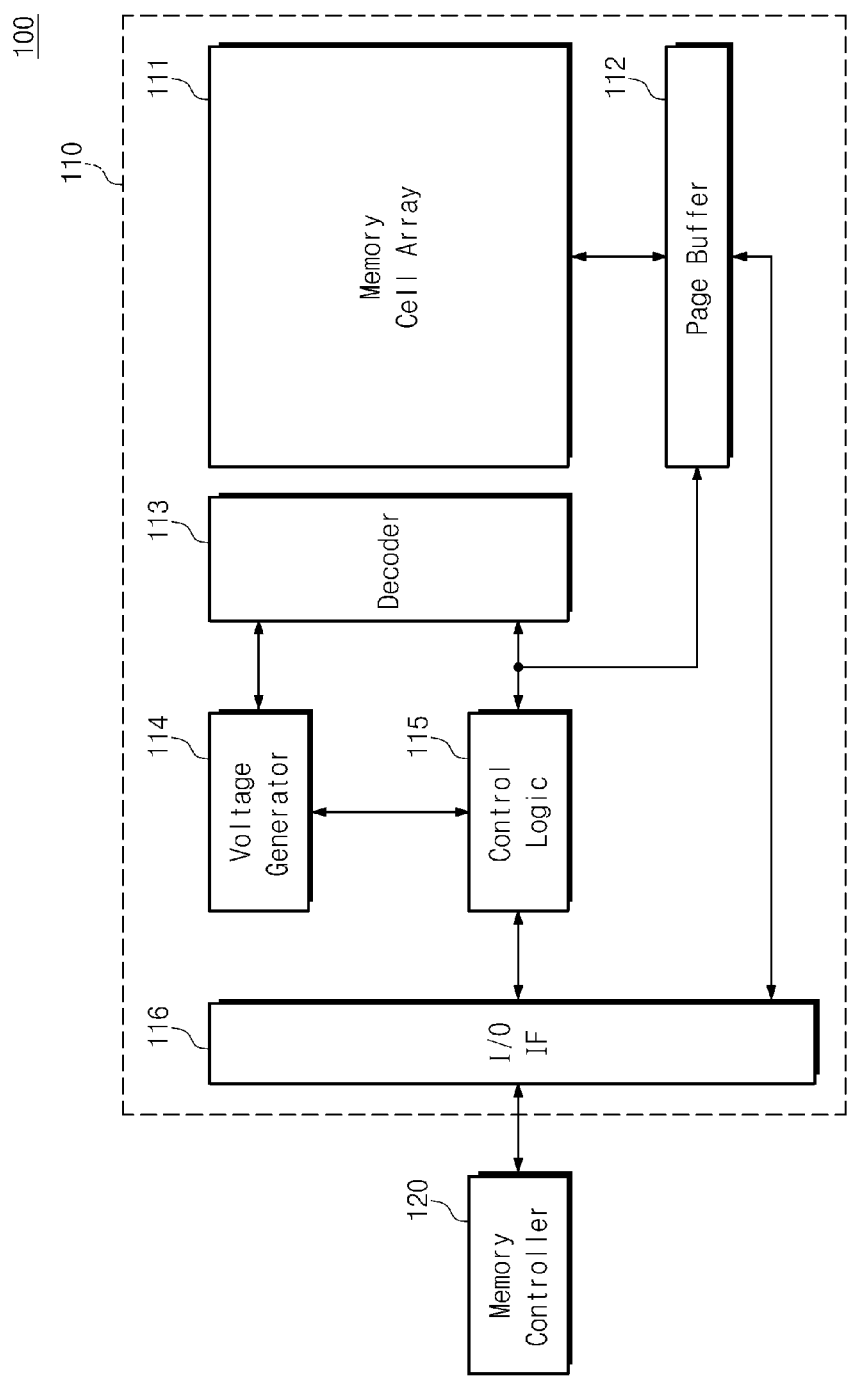
FIG. 1 is a block diagram illustrating a memory system according to an embodiment of the inventive concept.

Referring to FIG. 1, a memory system 10 generally comprises a memory device 110 and a memory controller (or a flash controller) 120.

For purposes of the following description, the memory device 110 is assumed to be a flash memory device. Alternatively, the memory device 110 might be a Phase-change Random Access Memory (PRAM), a Magneto-resistive Random Access Memory (MRAM), or a Resistive Random Access Memory (RRAM).

In the illustrated embodiment of FIG. 1, the memory device 110 comprises a memory cell array 111 capable of storing M-bit data per memory cell, where M is a positive integer. The memory cell array 111 may be divided into a plurality of regions, and the various regions may be defined according to a stored data type, (e.g., a general (payload) data region, a spare data region, etc.). The various regions of the memory cell array 111 may each include a plurality of memory blocks. Since the configuration of a memory array into a plurality of memory blocks is well known to those skilled in the art, description thereof will be omitted.

The memory device 110 further comprises a page buffer circuit 112, a decoder circuit 113, a voltage generation circuit 114, a control circuit 115, and an input/output interface circuit 116. The page buffer circuit 112 may be configured to read/program data from/to the memory cell array 111 according to the control of the control circuit 115. The decoder circuit 113 may be configured to be controlled by the control circuit 115, and select a memory block of the memory cell array 111 and a word line of the selected memory block. The selected word line may be driven by a word line voltage from the voltage generation circuit 114. The voltage generation circuit 114 may be configured to be controlled by the control circuit 115, and generate the word line voltage (for example, read voltage, program voltage, pass voltage, local voltage, and verification voltage) to be supplied to the memory cell array 111. The control circuit 115 may be configured to control general operation of the flash memory device 100.

Referring again to FIG. 1, the memory controller 120 may be configured to control the memory device 110 in response to a request from the outside (for example, host). Although not shown, the memory controller 120 may include a processing unit such as a central processing unit or a microprocessor, ECC, and a buffer memory, which is well known in the art.

The memory device 110 may increase a pass voltage by stages in response to a program voltage increased according to ISPP during the program operation in order to improve a pass voltage window. These features will be described in detail with reference to FIGS. 2 and 3.

Figure 2:
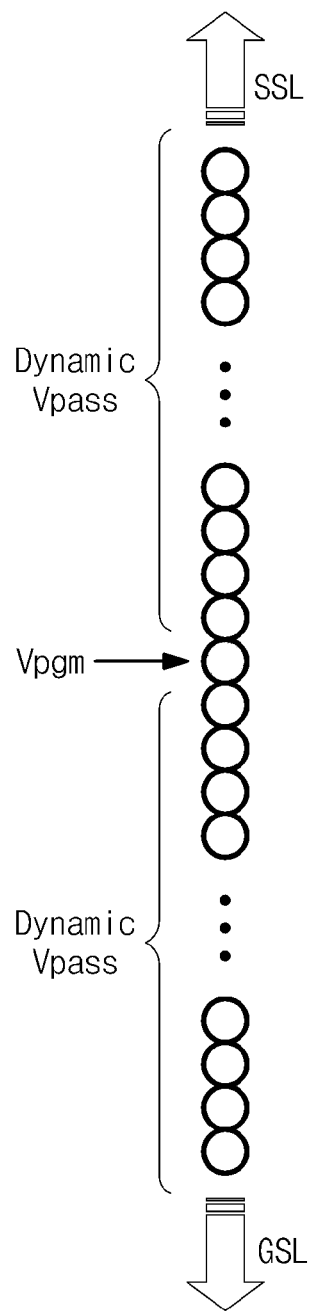
FIG. 2 is a conceptual diagram further illustrating a string of memory cells in the memory cell array of FIG. 1.

FIG. 2 is a conceptual diagram further illustrating a string of memory cells (hereafter a "string cell") in the memory cell array of FIG. 1.

Referring to FIG. 2, a program voltage Vpgm may be applied to a "central memory cell" located at or near the center of a string cell. A dynamic pass voltage Dynamic Vpass is applied to word lines of other memory cells. The dynamic pass voltage (Dynamic Vpass) refers to a pass voltage that is increased over a sequence of iterations according to a defined ISPP in order to improve the corresponding pass voltage window. The general use of an ISPP is conventionally understood, and those skilled in the art will recognize that many different ISPPs may be used within embodiments of the inventive concept. Hereinafter, one possible ISPP will be described in some additional detail with reference to FIG. 3 as an example of many other ISPPs that might be used.

Figure 3:
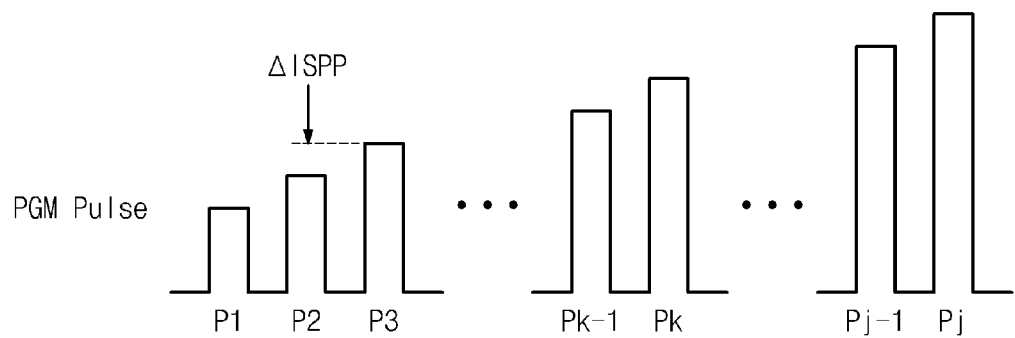
FIG. 3 is a timing diagram illustrating an incremental step pulse program (ISPP) according to an embodiment of the inventive concept.

FIG. 3 is a timing diagram illustrating an exemplary ISPP according to an embodiment of the inventive concept.

Referring to FIG. 3, a pulse-shaped program voltage (Vpgm) is incrementally increased over a sequence of iterations under the control of the exemplary ISPP. That is, in the illustrated example, the program voltage Vpgm is increased by a fixed increment value (ΔISPP) during each iteration to form a staircase-up program pulse waveform.

In order to improve a corresponding pass voltage window, a plurality of pass voltage sets are each respectively differently applied. For example, a lower program voltage set may include lower program pulses (e.g., P1 to P3), a middle program voltage set may include relatively higher (or midrange) program pulses (e.g., Pk−1 to Pk), and a high program voltage set may include even higher (or highest) program pulses (e.g., Pj−1 to Pj).

Thus, certain embodiments of the inventive concept may control the generation and provision of a pass voltage (Vpass) according to a defined ISPP. However, this control approach may cause an undesirable increase in the voltage potential of a floating gate associated with the selected memory cell. This phenomenon will be described in some additional detail with reference to FIG. 4.

Figure 4:
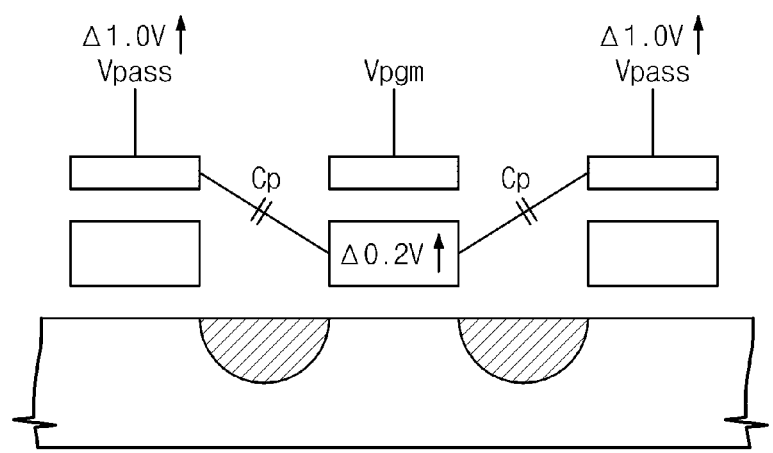
FIG. 4 is a conceptual cross-sectional diagram illustrating a memory cell string in the memory cell array of FIG. 1.

FIG. 4 is a diagram further illustrating the cell string of the memory cell array of FIG. 1. Referring to FIG. 4, a memory cell receiving a program voltage Vpgm is located between two memory cells receiving a pass voltage Vpass. Accordingly, a parasitic capacitance "Cp" develops between the floating gate of the memory cell receiving the program voltage Vpgm and the gate terminal of an adjacent memory cell. Although not shown in FIG. 4, the parasitic capacitance may develop between all cell strings in a memory cell array. This parasitic capacitance has the greatest effect on a selected memory cell receiving the program voltage Vpgm when located adjacent to two non-selected memory cells.

If the pass voltage Vpass is increased according to an ISPP, the parasitic capacitance may increase the potential of the floating gate of the memory cell receiving the program voltage Vpgm. Accordingly, in order to offset the effect by the parasitic capacitance, the level of the program voltage should be carefully controlled. This requirement is further described with reference to FIG. 5.

Figure 5:
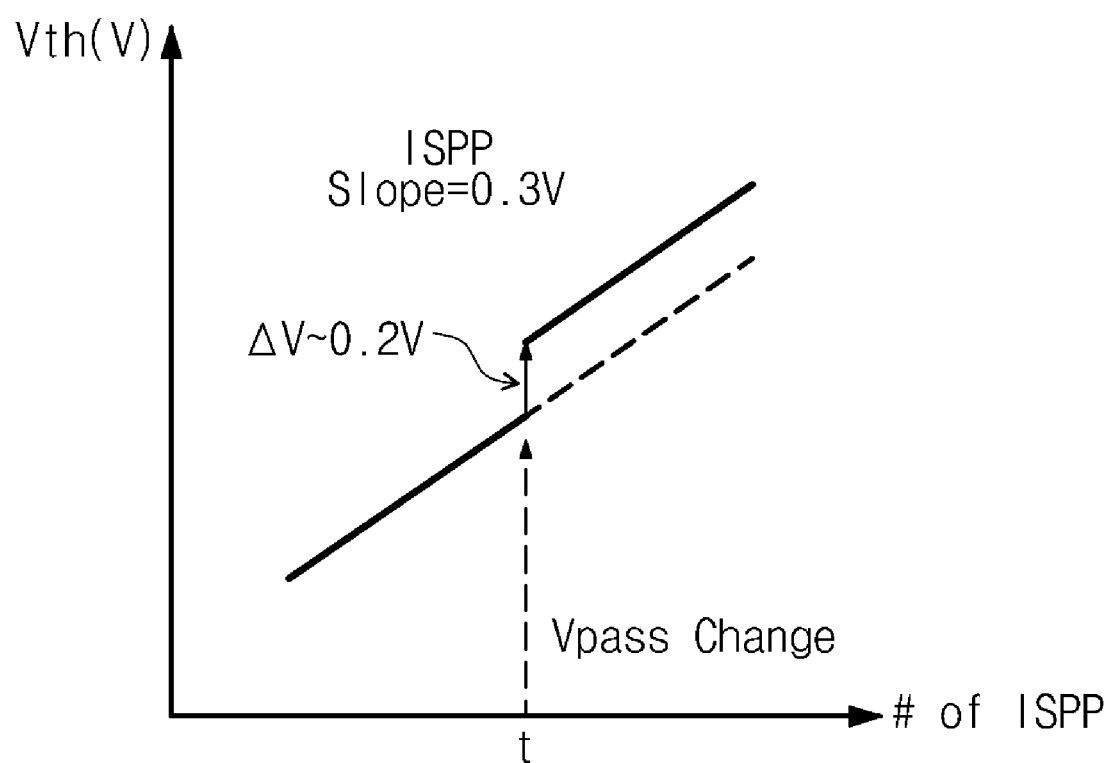
FIG. 5 is a graph illustrating a ratio of a threshold voltage to ISPP iterations (#)

FIG. 5 is a graph illustrating a ratio of a threshold voltage (Vth) to ISPP iteration.

Referring collectively to FIGS. 3 through 5, the horizontal axis of the graph is a number (#) of ISPP iterations, and the vertical axis of the graph is the level of the threshold voltage Vth. The assumed slope of the ISPP increment is about 0.3. That is, the program voltage Vpgm pulse is increased by about 0.3 V during each increment. A coupling ratio for the parasitic capacitance Cp of about 0.1 is also assumed.

Under these assumptions, if the pass voltage Vpass applied to an adjacent word line increases by about 1.0V, the potential on the floating gate of the memory cell connected to a selected word line increases by about 0.2V. Accordingly, the slope of the ISPP at an inflection point "t" for the pass voltage Vpass is further increased by about 0.2. This fluctuation in the program voltage pulse caused by the parasitic capacitance and corresponding effects are further described in relation to FIGS. 6 and 7.

Figure 6:
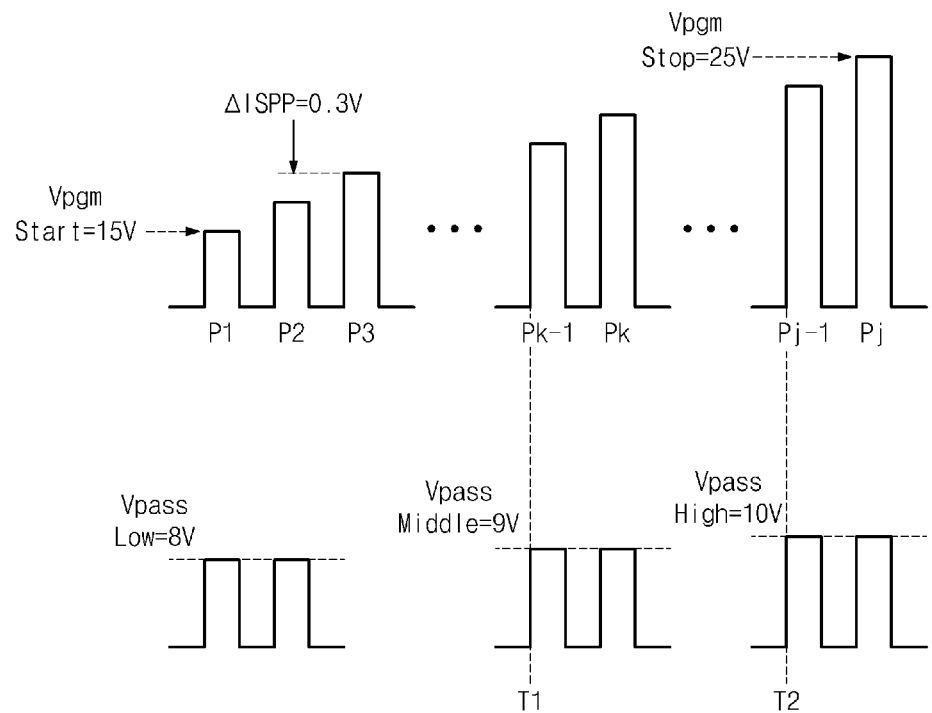
FIG. 6 is a timing diagram further illustrating the program voltage pulse in FIG. 5 and a related pass voltage.

FIG. 6 is a timing diagram further illustrating the program voltage pulse of FIG. 5 and a related pass voltage. The program voltage pulse is increased incrementally by about 0.3V per iteration from a start voltage (Vpgm Start) of about 15V up to a stop voltage (Vpgm Stop) of about 25V.

As described in FIG. 2, the dynamic pass voltage (Dynamic Vpass) refers to a pass voltage fluctuating according to ISPP. The dynamic pass voltage is increased from about 8V to about 9V at a point T1. The dynamic pass voltage is then increased from about 9V to about 10V at a point T2. The result of a program operation using the exemplary program voltage pulse and pass voltage is described in FIG. 7.

Figure 7:
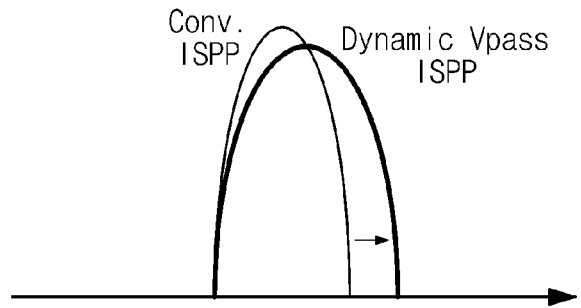
FIG. 7 is a graph illustrating a threshold voltage distribution according to the program voltage pulse of FIG. 6.

FIG. 7 is a graph illustrating a threshold voltage distribution defined by the program voltage pulse of FIG. 6. That is, if the program voltage pulse described in FIG. 6 is applied, the threshold voltage distribution shows an over-program phenomenon due to an increase in the program voltage caused by the parasitic capacitance. That is, as illustrated in FIG. 7, a dynamic pass voltage ISPP may have a broader threshold voltage Vth than a conventional ISPP. In view of the foregoing result, the increase in the width of ISPP must be carefully controlled. This requirement will be described in some additional detail with reference to FIG. 8.

Figure 8:
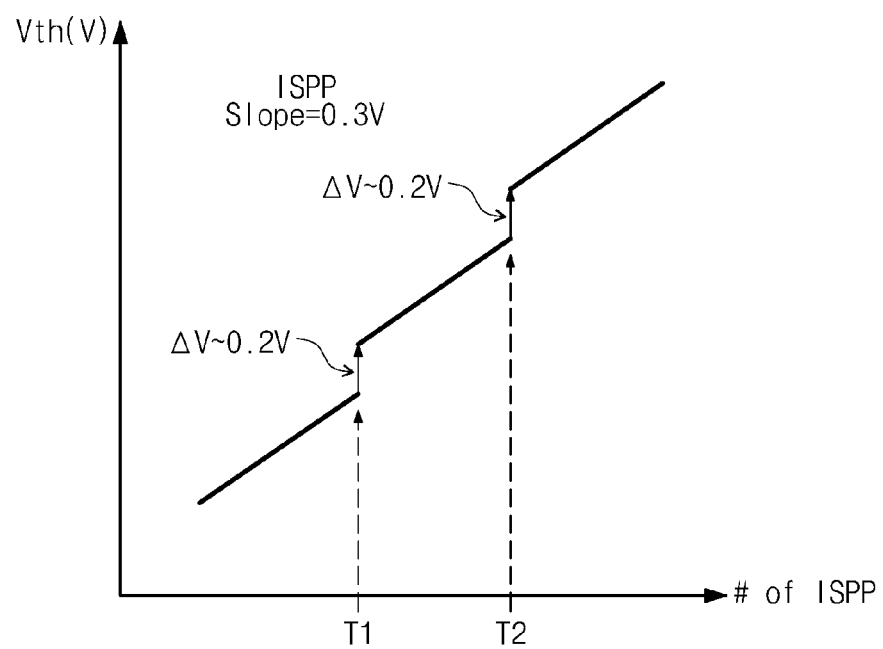
FIG. 8 is a graph illustrating a threshold voltage with respect to an ISPP of a program voltage in FIG. 6.

FIG. 8 is a graph further illustrating a relationship between a threshold voltage (Vth) and a number of ISPP iterations in the generating of the program voltage shown in FIG. 6.

Referring to FIG. 8, the slope of the program voltage pulse is assumed to be about 0.3. That is, the program voltage pulse is increased by about 0.3V. If the dynamic pass voltage is increased from about 8V to about 9V at point T1, the potential of the floating gate of a memory cell connected to a selected word line may be increased by the parasitic capacitance Cp described in FIG. 4.

For example, a coupling ratio for the parasitic capacitance Cp is assumed to be about 0.1. If the dynamic pass voltage increases from about 8V to about 9V, the potential of the floating gate of the memory cell connected to the selected word line increases by about 0.2V. Accordingly, a $K-1^{th}$ program voltage pulse Pk−1 may be increased by about 0.2V. And if the dynamic pass voltage increases from about 9V to about 10V at point T2, the potential of the floating gate of the memory cell connected to the selected word line increases by the parasitic capacitance described in FIG. 4.

Under the foregoing assumptions, if the dynamic pass voltage is increased from about 9V to about 10V, the potential of the floating gate of the memory cell connected to the selected word line is increased by about 0.2V. Accordingly, a $J-1^{th}$ program voltage pulse Pj−1 may be increased by about 0.2V.

In certain embodiments of the inventive concept, it is assumed that the level of the applied pass voltage fluctuates in accordance with each program voltage pulse. Also, the program voltage pulse according to ISPP may be divided into several program voltage pulse sets, and the level of the applied pass voltage may fluctuate in accordance with each set.

During application of $J-1^{th}$ and $J^{th}$ program voltage pulse Pj−1 and Pj during which the occurrence of the program voltage disturb is most concentrated, the increase in width of the program voltage pulse is controlled.

In order to offset the influence of the parasitic capacitance, the increased width of the program voltage pulse may be appropriately controlled when a pass voltage applied to a non-selected word line fluctuates. That is, the program voltage pulse is controlled to be increased while offsetting the potential increased caused by the parasitic capacitance. This approach will be described in some additional detail with reference to FIG. 9.

Figure 9:
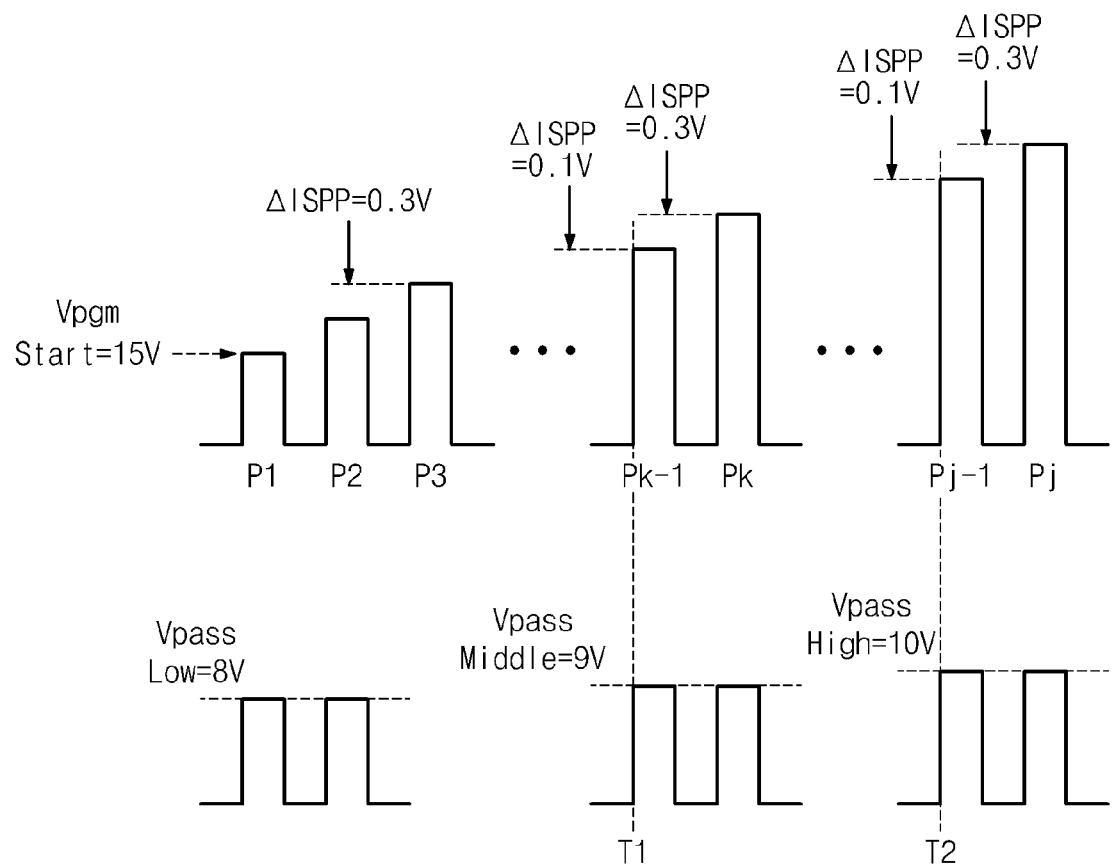
FIG. 9 is a timing diagram further illustrating a program voltage and a related pass voltage according to an embodiment of the inventive concept.

FIG. 9 is a timing diagram illustrating a program voltage and a pass voltage according to an embodiment. Referring to FIG. 9, a program voltage and a dynamic pass voltage will be described.

The program voltage pulse is increased by an increment of about 0.3V from a start voltage of about 15V up to a stop voltage of about 25V. However, the program voltage pulse Vpgm Pulse is increased by only about 0.1V at "control iterations" occurring at (e.g.) the points T1 and T2 of FIG. 6.

These control increments correspond to points at which the pass voltage fluctuates under the influence of the parasitic capacitance.

As previously noted, the dynamic pass voltage increases from about 8V to about 9V at point T1, and increases from about 9V to about 10V at point T2. Fluctuation of the dynamic pass voltage may further increase the level of the program pulse Vpgm Pulse as it is increased by the parasitic capacitance Cp described in FIG. 4. Thus, over-programming may occur as illustrated in FIG. 7.

Accordingly, the program voltage pulse is increased by offsetting a voltage level associated with the parasitic capacitance Cp at points T1 and T2 at which the dynamic pass voltage is expected to fluctuate. Hence, under the working assumptions of the illustrated embodiments, the program voltage pulse is increased by a "control increment" of only about 0.1V at control iterations occurring at points T1 and T2. Otherwise, the program voltage pulse is increased from the start voltage of 15V up to the stop voltage by "normal increments" of about 0.3V.

In order to offset the influence of the parasitic capacitance, the increase width of the program voltage pulse may be appropriately controlled when the pass voltage applied to a non-selected word line fluctuates. That is, fluctuation of the program voltage under the influenced of a parasitic capacitance may be offset according to embodiments of the inventive concept. As a result, a pass voltage applied to a non-selected word line adjacent to a selected word line may be constantly maintained. Other non-selected word lines receive the dynamic pass voltage. This will be described in some additional detail with reference to FIGS. 10 and 11.

Figure 10:
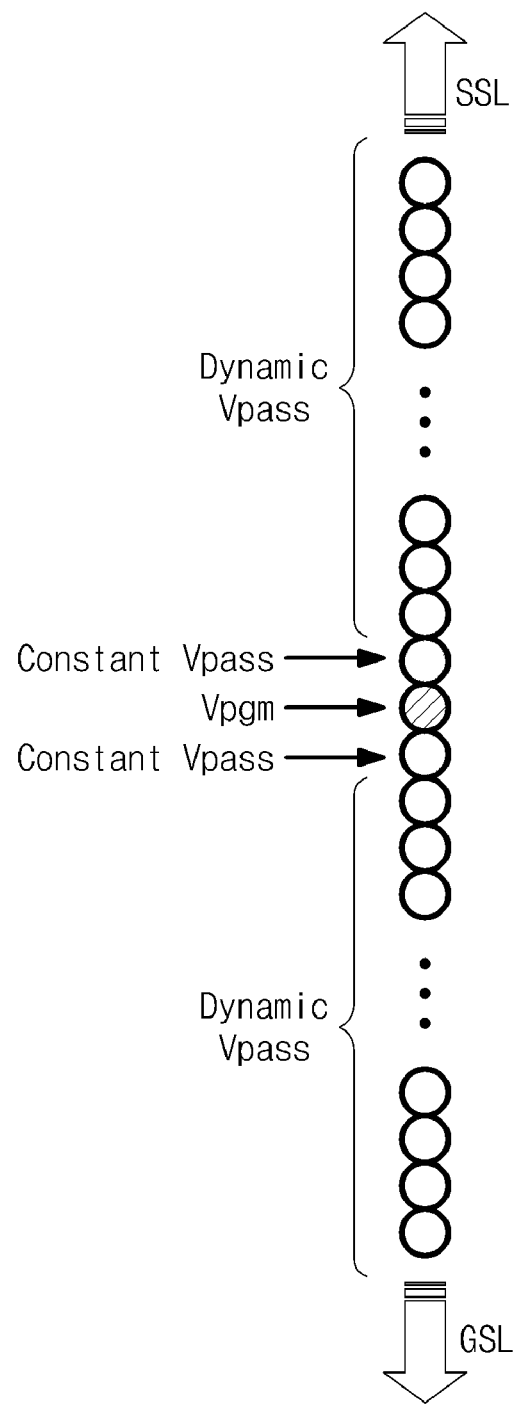
FIG. 10 is a conceptual diagram illustrating a memory cell string provided with a program voltage and pass voltage according to another embodiment of the inventive concept.

FIG. 10 is a diagram illustrating a cell string receiving a program voltage and pass voltage according to another embodiment of the inventive concept.

As illustrated in FIG. 10, a parasitic capacitance is assumed between a memory cell receiving the program voltage (Vpgm) and adjacent memory cells. In order to offset the influence by the parasitic capacitance, a pass voltage (Constant Vpass) having a constant voltage level is applied to the memory cells adjacent to the memory cell receiving the program voltage. A dynamic pass voltage (Dynamic Vpass) is applied to other memory cells. In the illustrated embodiment, the dynamic pass voltage may be identical to the one described in relation to FIG. 2. These control voltages and their various relationships will be further described in some additional detail with reference to FIG. 11.

Figure 11:
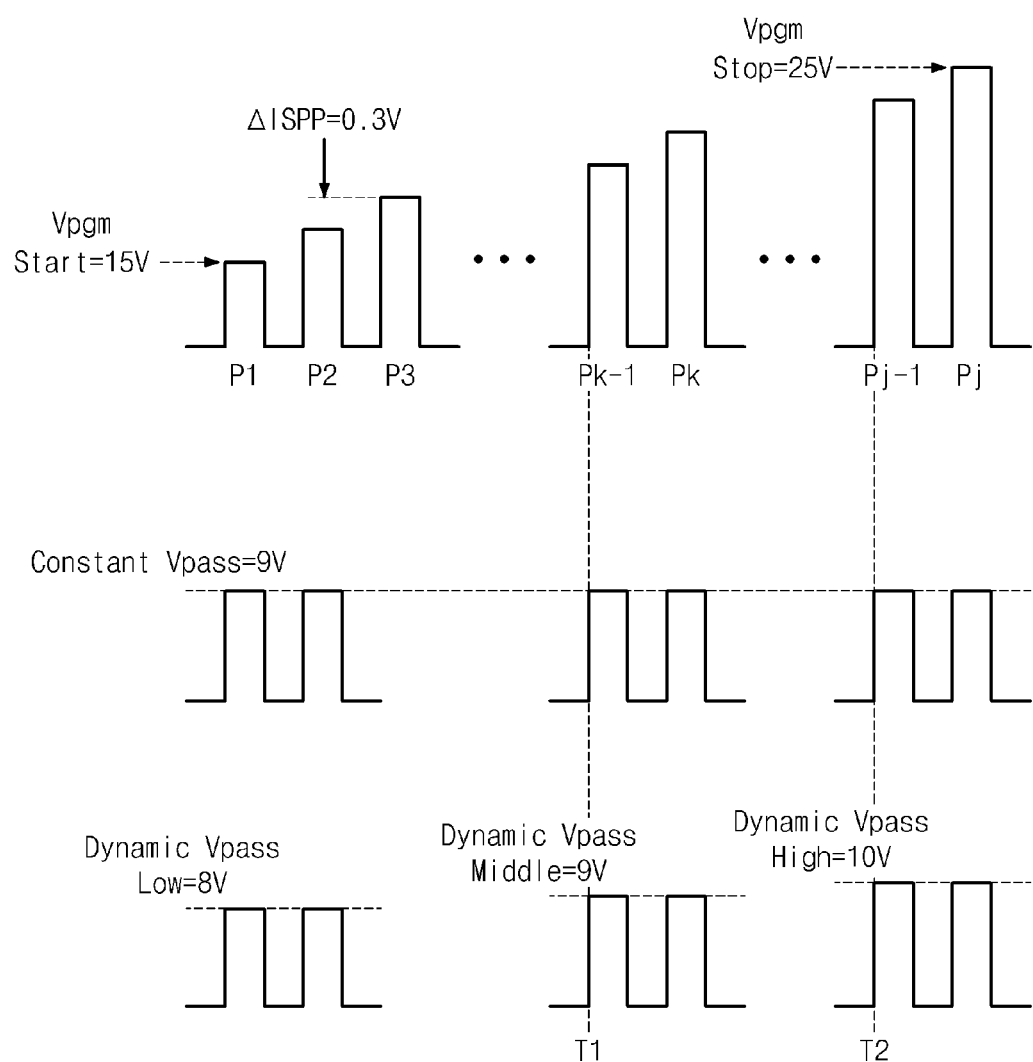
FIG. 11 is a timing diagram further illustrating the program voltage and pass voltage of FIG. 10.

FIG. 11 is a timing diagram further illustrating the program voltage and pass voltage of FIG. 10. As illustrated in FIG. 11, the program voltage (Vpgm), as well as the pass voltage (Constant Vpass) and dynamic pass voltage (Dynamic Vpass) fluctuating in accordance with the program voltage, are shown.

Similarly to FIG. 6, the program voltage is increased from a start voltage (Vpgm Start) of about 15V up to a stop voltage (Vpgm Stop) of about 25V by normal increments of about 0.3V. As described in FIG. 2, the dynamic pass voltage refers to a pass voltage that fluctuates according to the ISPP defining the program voltage.

The dynamic pass voltage of the illustrated embodiment increases from about 8V to about 9V at a first control iteration (point T1), and increases from about 9V to about 10V at a second control iteration (point T2). The fluctuation of the pass voltage may further increase the voltage of the program voltage if it were constantly increased by the parasitic capacitance Cp described in FIG. 4. Thus, over-programming may occur as described in FIG. 7.

A memory cell connected to a selected word line receives the program voltage. Among memory cells connected to non-selected word lines, a memory cell adjacent to the selected memory cell receiving the program voltage receives the pass voltage. In the illustrated embodiment, the pass voltage is about 9V. Other (non-adjacent) memory cells connected to non-selected word lines receive the dynamic pass voltage.

The parasitic capacitance of the memory cells adjacent to the selected memory cell has a greatest effect on the selected memory cell. Accordingly, the pass voltage applied to the adjacent memory cell is maintained constant to offset the influence of the parasitic capacitance.

Hereinafter, a method of preventing an over-programming condition potentially resulting from a parasitic capacitance when different pass voltages are applied to various word lines is described.

Figure 12:
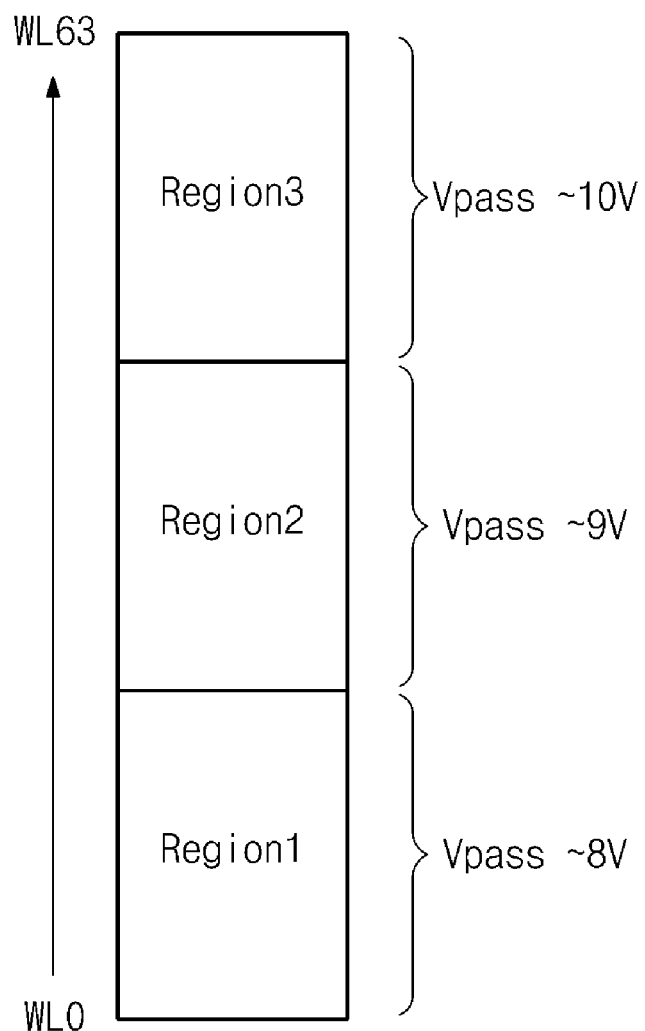
FIG. 12 is a diagram illustrating a memory cell string provided with different pass voltages via word lines in various word line regions.

FIG. 12 is a conceptual diagram illustrating memory cells in a cell string receiving different pass voltages via associated word lines according to the position of the memory cells within the cell string.

As illustrated in FIG. 12, the cell string is divided into first, second and third regions (Region 1, Region 2, and Region 3), each containing a plurality of word lines connected to memory cells in the cell string. For example, assuming 64 word lines arranged in parallel to access data from a corresponding number of memory cells forming a cell string, the first region may include word lines 0 through 19, the second region may include word lines 20 through 43, and the third region may include word lines 44 through 63. A pass voltage (Vpass) of about 8V is applied to memory cells in the first region. A pass voltage of about 9V is applied to memory cells in the second region, and a pass voltage of about 10V is applied to memory cells in the third region.

With these working assumptions, an exemplary method of applying a pass voltage to memory cells of a cell string according to an embodiment of the inventive concept will be described with reference to FIGS. 13 through 15.

Figure 13:
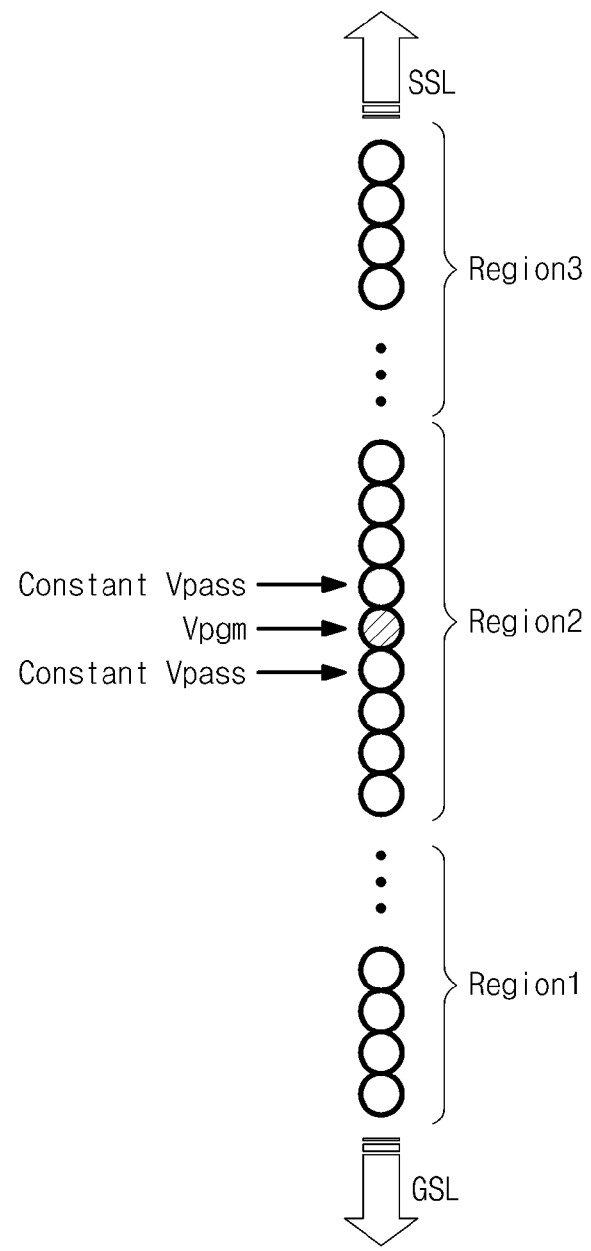
FIG. 13 is a conceptual diagram illustrating application of a program voltage and pass voltage according to another embodiment of the inventive concept.

FIG. 13 is a diagram illustrating an application of a program voltage and pass voltage according to another embodiment of the inventive concept. Referring to FIG. 13, the memory cell array 111 of FIG. 1 includes a plurality of cell strings, only one of which is illustrated in FIG. 13 as an example.

A program voltage (Vpgm) is applied to a selected word line. A pass voltage (Constant Vpass) is applied to word lines adjacent to the selected word line. A dynamic pass voltage (Dynamic Vpass) is applied to other non-selected word lines in each of the first through third regions (Region1 through Region 3). The dynamic pass voltage may be identical to that described in relation to FIG. 12. The pass voltage, as applied across the various regions, will be described in some additional detail with reference to FIG. 14.

Figure 14:
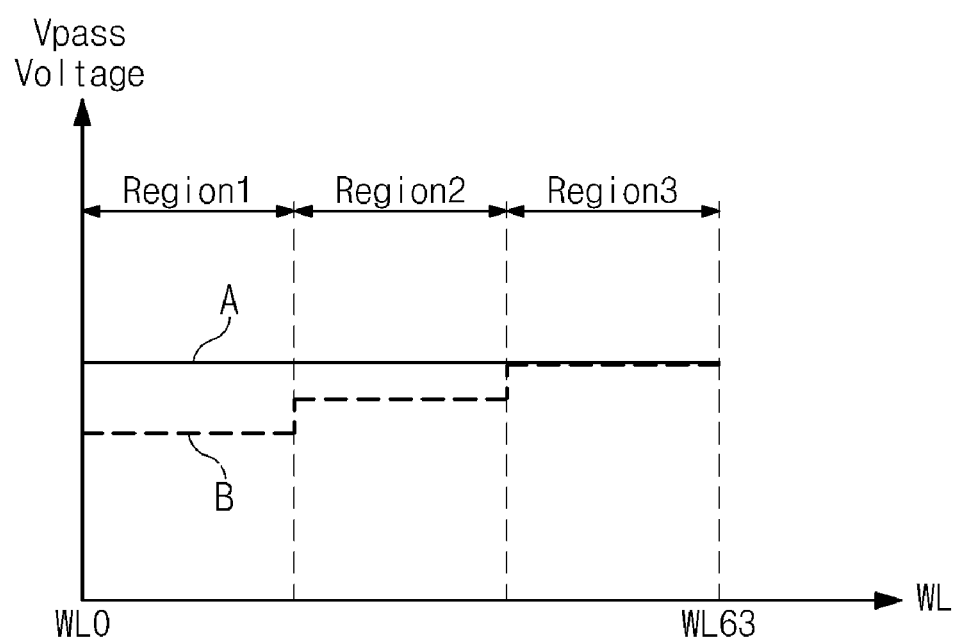
FIG. 14 is a graph illustrating an exemplary level for the pass voltage of FIG. 13.

FIG. 14 is a graph illustrating the pass voltage applied in the embodiment of the inventive concept illustrated in FIG. 13.

Referring to FIG. 14, the horizontal axis of the graph indicate location of a word line within the cell string (WL0 and WL63 being assumed as outermost (or top and bottom) word lines for the cell string), and the vertical axis of the graph is the level of the pass voltage (Vpass). Indicated levels "A" and "B" for the pass voltage are applied to memory cells connected to non-selected word lines. The "A" level pass voltage or constant pass voltage (Constant Vpass) is applied to memory cells adjacent to the selected memory cell receiving the program voltage (Vpgm). The "B" level pass voltage Vpass or pass voltage is applied to all other non-selected memory cells.

The constant pass voltage is applied to the memory cell adjacent to the selected memory cell and is maintained constant regardless of memory cell location within the first through third regions. On the contrary, the pass voltage applied to other non-selected memory cells is gradually increased from the first (or lower) region (Region 1) to the third (or upper) region (Region 3) with the second (or intermediate) region receiving a pass voltage between the lower one applied to the first region and the higher one applied to the third region. For example, in certain embodiments of the inventive concept, the pass voltage (Vpass) is about 8V for the first region, about 9V for the second region, and about 10V for the third region.

That is, as the program operation progresses from a first word line (e.g., word line 0) to a last word line (e.g., word line 63), the pass voltage applied to memory cells adjacent to a selected word line is maintained at about 8V. However, a variable pass voltage is applied to non-adjacent, non-selected word lines across the plurality of regions. Thus, a constant pass voltage is applied to a memory cell adjacent to a memory cell receiving the program voltage to block over-programming due to fluctuation of the pass voltage. The result of the program operation according to the illustrated embodiment is further described in FIG. 18.

Hereinafter, a method of applying a pass voltage according to an embodiment of the inventive concept will be described in some additional detail with reference to the flowchart of FIG. 15. FIG. 15 is a flowchart summarizing a method of applying the pass voltage of FIG. 13.

Figure 15:
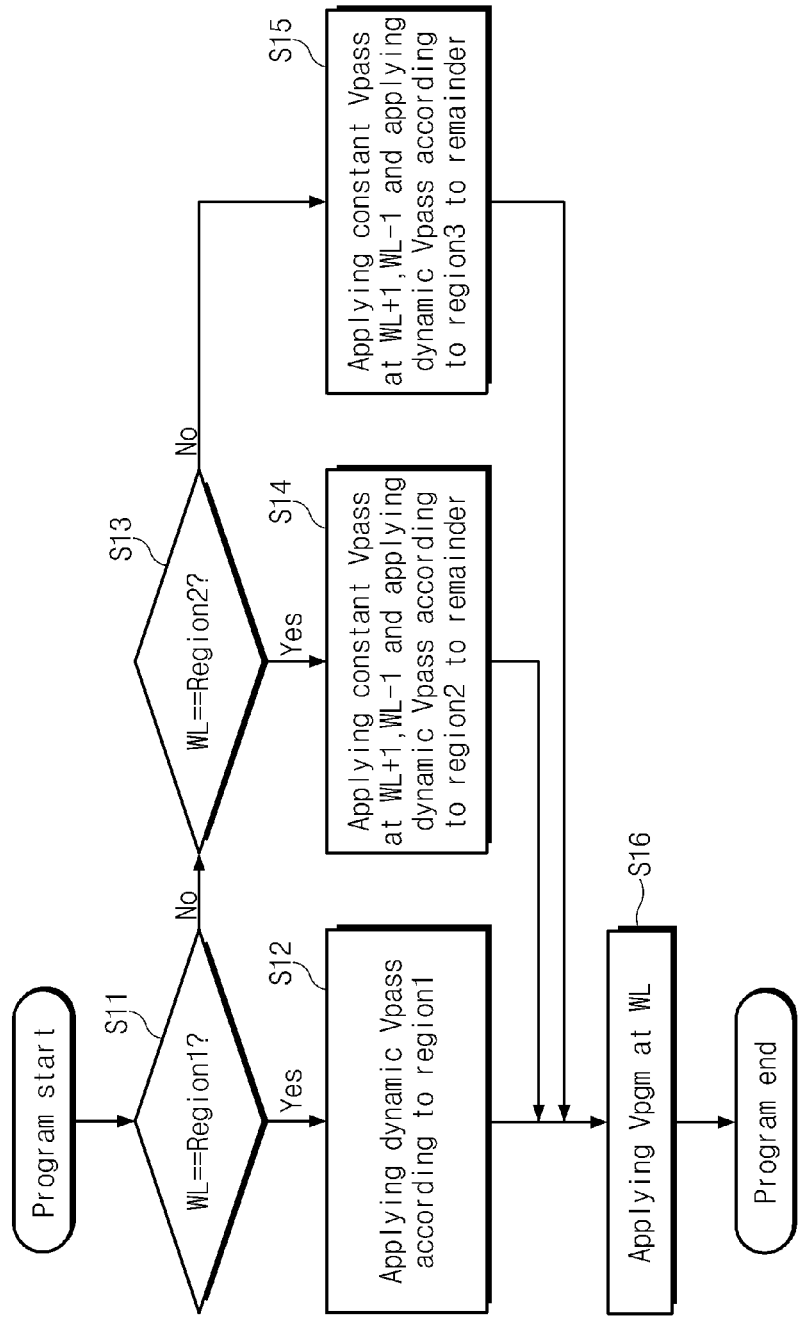
FIG. 15 is a flowchart summarizing a method of providing the pass voltage of FIG. 13.

Referring collectively to FIGS. 1 and 15, control logic 115 determines whether a selected word line WL belongs to a first region (S11=yes), or whether the selected word line WL belongs to a second region (S11=no, and S13=yes), or whether the selected word line WL belongs to a third region (S11=no, and S13=no).

If the selected word line belongs to the first region, the voltage generator 114 applies a dynamic pass voltage to the word line of the first region (S12).

But if the selected word line belongs to the second region, the voltage generator 114 applies the dynamic pass voltage to according to the second region, and applies a constant pass voltage to word lines WL−1 and WL+1 adjacent to the selected word line (WL) (S14).

But if the selected word line belongs to the third region, the voltage generator 114 applies the dynamic pass voltage according to the third region, and applies the constant pass voltage to word lines WL−1 and WL+1 adjacent to the selected word line (WL) (S15).

Then, the voltage generator 114 applies a program voltage (Vpgm) to the selected word line WL, and control logic 115 progresses the program operation (S16).

A pass voltage applied to non-selected word lines adjacent to a selected word line is always maintained constant upon program operation. Accordingly, an influence due to the fluctuation of the pass voltage applied to the non-selected word line adjacent to the selected word line may be offset upon program operation, thereby improving an over-program.

Figure 16:
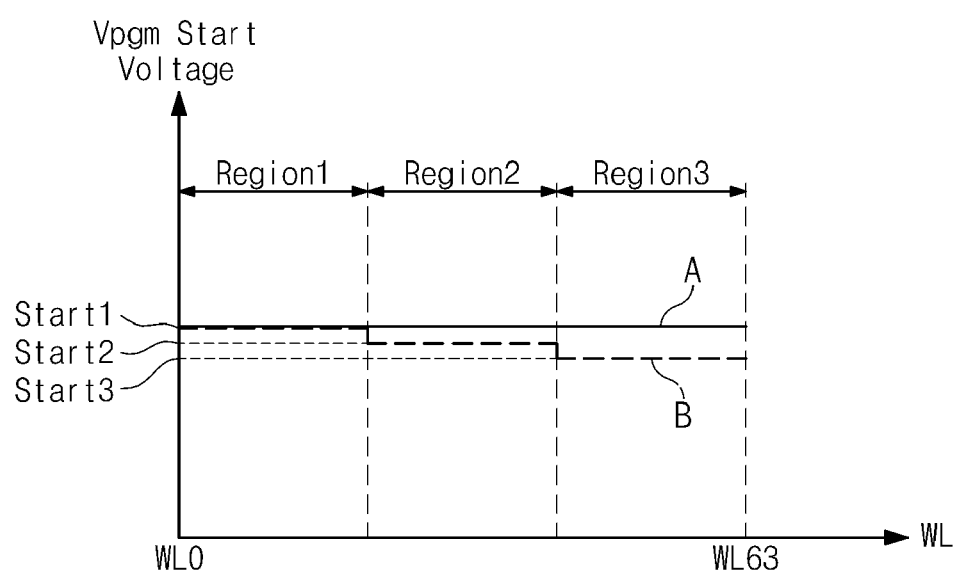
FIG. 16 is a timing diagram illustrating an exemplary program voltage according to the another embodiment of the inventive concept.

FIG. 16 is a timing diagram illustrating a program voltage according to another embodiment of the inventive concept.

Referring to FIG. 16, the horizontal axis of the graph indicates word line location within a cell string, and the vertical axis of the graph is the level of the program start voltage. A first program start voltage "A" is a start voltage for a program voltage that is normally increased according to a defined ISPP. A second program start voltage "B" is a start voltage for a program voltage that is increased according to an embodiment of the inventive concept. That is, an increase width of the second program start voltage "B" is controlled at control iterations when a pass voltage Vpass fluctuates.

Figure 18:
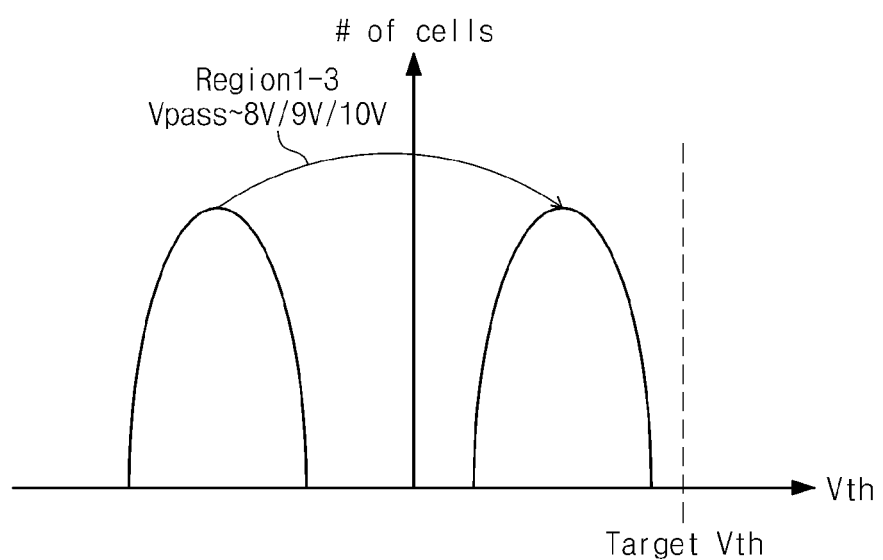
FIG. 18 is a graph illustrating the results of a program operation using the program voltage of FIGS. 14 and 16.

For example, it is again assumed that a cell string is accessed by 64 word lines, arranged in a first region including word lines 0 through 19, a second region including word lines 20 through 43, and a third region including word line 44 through 63. This is just one example, as will be appreciated by those skilled in the art. As illustrated in FIG. 18, a dynamic pass voltage (Dynamic Vpass) is about 8V in the first region, about 9V in the second region, and about 10V in the third region Region3.

In embodiments of the inventive concept using different program start voltages per memory cell region, a first start voltage of about 15V may be used.

Since the pass voltages of the first and second regions fluctuate during programming of memory cell connected to word lines in the second region, the potential of the memory cell connected to the selected word line is increased by the parasitic capacitance. Accordingly, program start voltage may be regulated to be a different second start voltage in the second region. For example, the second start voltage may be increased from the first start voltage by a voltage potential increased by the parasitic capacitance.

Similarly, since the pass voltages of the first and second regions fluctuate during programming of memory cells connected to word lines in the third region, the potential of a memory cell connected to a selected word line may be increased by the parasitic capacitance. Accordingly, the third program start voltage may be regulated for the third region Region3. For example, the third start voltage may be increased from the second start voltage by a voltage potential increased by the parasitic capacitance. A result of the program operation according to the program start voltage described in FIG. 16 will be illustrated in FIG. 18.

Figure 17:
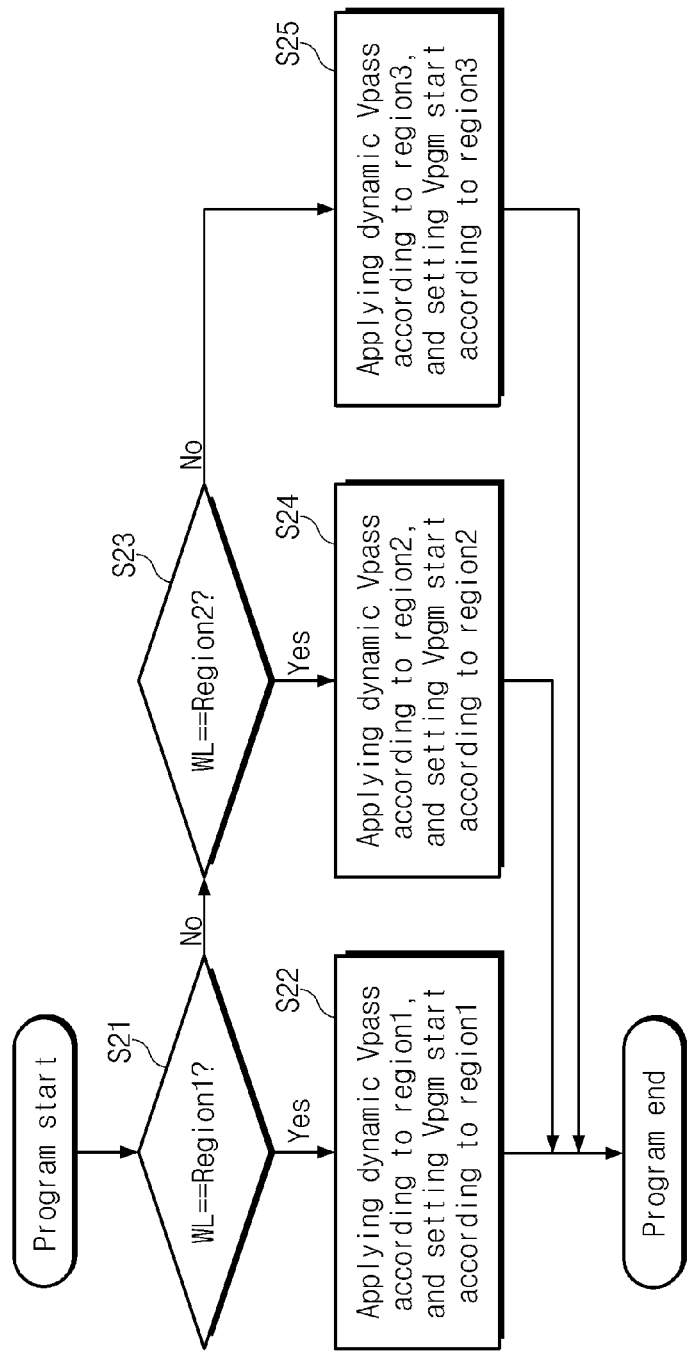
FIG. 17 is a flowchart summarizing a method of providing the program voltage of FIG. 16.

Also, a method of applying a program voltage according to an embodiment will be described in detail with reference to a flowchart in FIG. 17. FIG. 17 is a flowchart summarizing a method of applying the program voltage of FIG. 16.

Referring to FIGS. 1, 16 and 17, a control logic 115 determines whether a selected word line WL belongs to a first region (S21). If so, operation S22 is performed. If not, operation S23 is performed.

A voltage generator 114 applies a dynamic pass voltage according to the first region Region1 to word lines of the first region (S22). The voltage generator 114 applies a program start voltage Vpgm start according to the first region to the selected word line WL.

Else, the control logic 115 determines whether the selected word line WL belongs to a second region (S23). If so, operation S24 is performed. If not, operation 25 is performed.

The voltage generator 114 applies a dynamic pass voltage according to the second region to word lines of the second region (S24). The voltage generator 114 applies a program start voltage Vpgm start according to the second region to the selected word line WL.

The voltage generator 114 applies a dynamic pass voltage according to a third region Region3 to word lines of the third region (S25). The voltage generator 114 applies a program start voltage according to the third region to the selected word line.

A pass voltage applied to non-selected word lines adjacent to a selected word line is always maintained constant upon program operation. Accordingly, an influence due to the fluctuation of the pass voltage applied to the non-selected word line adjacent to the selected word line may be offset upon program operation, thereby reducing the occurrence of over-programming.

FIG. 18 is a graph illustrating the results of a program operation using the program voltage of FIGS. 14 and 16.

As illustrated in FIG. 12, a pass voltage of about 8V is applied to a memory cell of the word line in the first region. A pass voltage of about 9V is applied to a memory cell of the word line in the second region. A pass voltage of about 10V is applied to a memory cell of the word line in the third region.

When the program operation according to the method of FIGS. 14 and 16 is performed, as illustrated in FIG. 18, all memory cells in the first through third regions may be programmed to be within a target threshold voltage (Target Vth).

Figure 19:
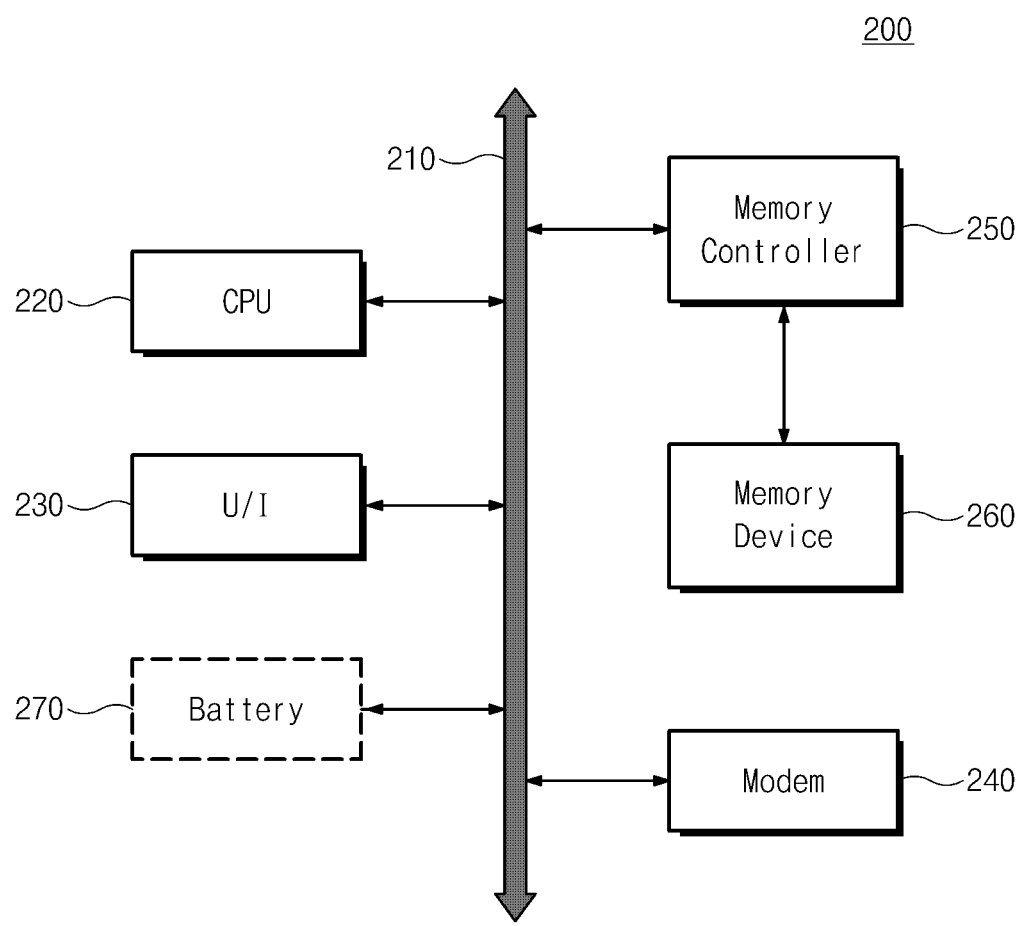
FIG. 19 is a block diagram illustrating a computational system incorporating a memory device according to an embodiment of the inventive concept.

FIG. 19 is a block diagram illustrating a computational system according to an embodiment.

Referring to FIG. 19, a computational system 200 comprises a central processing unit 220 electrically connected to a bus 210, a user interface 230, a modem 240 such as a baseband chipset, a memory controller 250, and a memory device 260. The memory controller 250 controls the memory device 260. The memory device 260 stores N-bit data, where N is a positive integer processed or to be processed by the central processing unit 220 through the memory controller 250.

When the computational system 200 is a mobile device, a battery for supplying power to the computational system may additionally be provided. Although not shown in the drawings, it will be apparent to those skilled in the art that an application chipset, a camera image processor (CIS), a mobile DRAM, and the like may be further provided in the computational system 200.

As a preferred example, the memory device 260 may include the flash memory device in FIGS. 1 through 18. Also, the memory controller 250 may include a flash memory controller that controls the flash memory device.

For example, the memory device 260 and the memory controller 250 may include a Solid State Drive (SSD) that uses a nonvolatile memory to store data. Otherwise, the memory device 260 and the memory controller 250 may include a memory card that uses a nonvolatile memory to store data.

Figure 20:
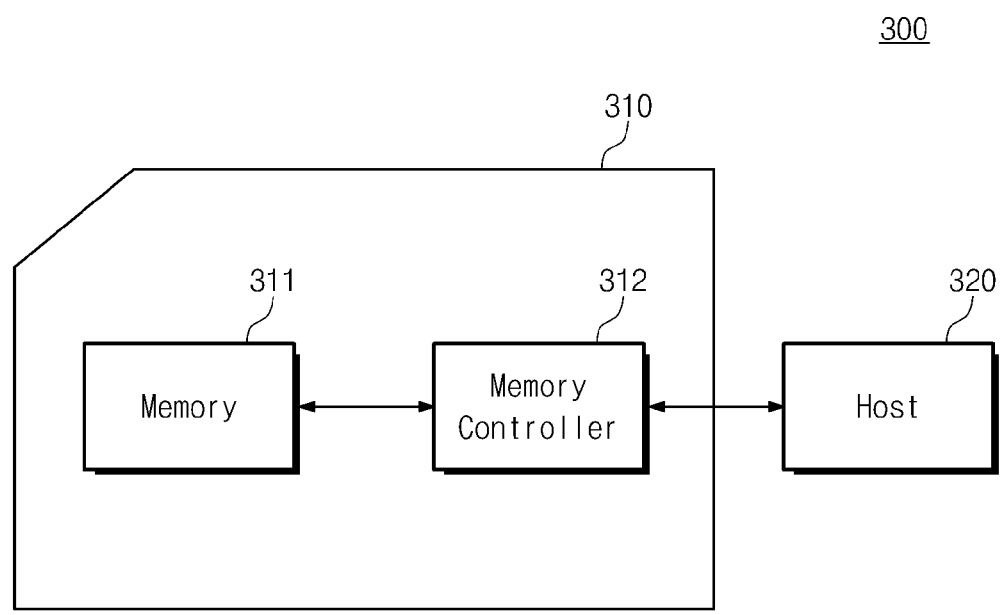
FIG. 20 is a block diagram illustrating a memory-based storage device according to an embodiment of the inventive concept.

FIG. 20 is a block diagram illustrating a memory-based storage device according to the embodiments.

Referring to FIG. 20, a memory-based storage system 300 comprises a memory-based storage device 310 and a host 320 connected thereto. The memory-based storage device 310 may include a memory 311 and a memory controller 312 that controls the memory 311.

For example, a memory-based storage device 310 may be a flash memory card such as a SD card. Otherwise, the memory-based storage device 310 may include a SIM or USIM card. That is, the memory-based storage device 310 may be a card that satisfies certain industrial standards for the use of electronic devices such as digital cameras and personal computers.

As a preferred example, the memory 311 may include the flash memory device described in FIGS. 1 through 16. Also, the memory controller 312 may include a flash memory controller that controls the flash memory device.

According to the embodiments, the fluctuation of a program voltage Vpgm influenced by a parasitic capacitance can be offset.

According to the embodiments, a pass voltage window can be improved by preventing over-programming.

The above-disclosed subject matter is to be considered illustrative, and not restrictive, and the appended claims are intended to cover all such modifications, enhancements, and other embodiments, which fall within the scope of the present inventive concept. Thus, to the maximum extent allowed by law, the scope of the present inventive concept is to be determined by the broadest permissible interpretation of the following claims and their equivalents, and shall not be restricted or limited by the foregoing detailed description.

What is claimed is:

1. A nonvolatile memory device comprising:
a memory cell array comprising a plurality of memory cells arranged in word lines and bit lines;
a high-voltage generator configured to generate a program voltage pulse applied to a selected word line among the word lines during a program operation, and a pass voltage applied to a non-selected word line during the program operation; and
control logic configured to iteratively increase the level of the program voltage pulse by an increment value and to adjust the level of the pass voltage according to another increment value during the program operation,
wherein the pass voltage is increased to a predetermined level after being maintained at a constant level during a predetermined number of cycles of the incremental program voltage pulse.

2. The nonvolatile memory device according to claim 1, wherein the control logic is further configured to fix the level of the pass voltage applied to a non-selected word line adjacent to the selected word line at a constant level during the program operation.

3. The nonvolatile memory device according to claim 1, wherein the control logic is further configured to adjust the level of the pass voltage according to the iterative increases in the level of the program voltage pulse.

4. The nonvolatile memory device according to claim 1, wherein the control logic is further configured to iteratively increase the level of the program voltage pulse according to an incremental step pulse program (ISPP).

5. The nonvolatile memory device according to claim 4, wherein the incremental value is fixed, and the control logic is further configured to increase the level of the program voltage during successive iterations to form a staircase-up program pulse waveform.

6. The nonvolatile memory device according to claim 5, wherein the pass voltage applied to the non-selected word line during the program operation fluctuates according to the ISPP defining the program voltage.

7. A nonvolatile memory device comprising:
a memory cell array comprising a plurality of memory cells arranged in word lines and bit lines;
a high-voltage generator configured to generate a program voltage pulse applied to a selected word line among the word lines during a program operation, and a pass voltage applied to a non-selected word line during the program operation; and
control logic configured to iteratively increase the level of the program voltage pulse by an increment value and to adjust the level of the pass voltage according to another increment value during the program operation,
wherein the control logic is further configured to increase the program voltage pulse according to fluctuation of the pass voltage.

8. The nonvolatile memory device according to claim 7, wherein the program voltage pulse applied to the selected word line is influenced by an increase in the pass voltage applied to a non-selected word line adjacent to the selected word line.

9. A nonvolatile memory device comprising:
a memory cell array comprising a plurality of memory cells arranged in word lines and bit lines;

a high-voltage generator configured to generate a program voltage pulse applied to a selected word line among the word lines and at least one pass voltage applied to a non-selected word line; and control logic configured to apply an iteratively increasing program voltage pulse to the selected word line during a program operation, to apply an incrementally increasing pass voltage to non-selected word lines that are not adjacent to the selected word line during the program operation, and to apply a fixed pass voltage to a non-selected word line adjacent to the selected word line at a constant level during the program operation.

* * * * *